United States Patent
Jørgensen

(10) Patent No.: US 10,270,313 B2
(45) Date of Patent: Apr. 23, 2019

(54) LINEAR ACTUATOR SYSTEM

(71) Applicant: LINAK A/S, Nordborg (DK)

(72) Inventor: Rolf Jørgensen, Middelfart (DK)

(73) Assignee: Linak A/S, Nordborg (DK)

( * ) Notice: Subject to any disclaimer, the term of this patent is extended or adjusted under 35 U.S.C. 154(b) by 45 days.

(21) Appl. No.: 15/526,637

(22) PCT Filed: Nov. 12, 2015

(86) PCT No.: PCT/DK2015/000045
§ 371 (c)(1),
(2) Date: May 12, 2017

(87) PCT Pub. No.: WO2016/074678
PCT Pub. Date: May 19, 2016

(65) Prior Publication Data
US 2017/0324301 A1 Nov. 9, 2017

(30) Foreign Application Priority Data

Nov. 12, 2014 (DK) .................................. 2014 00660

(51) Int. Cl.
*H02K 41/02* (2006.01)
*H02K 7/06* (2006.01)
(Continued)

(52) U.S. Cl.
CPC ............. *H02K 7/063* (2013.01); *F16H 25/20* (2013.01); *F16H 35/18* (2013.01); *H02K 5/225* (2013.01);
(Continued)

(58) Field of Classification Search
CPC ........ H02K 11/33; H02K 7/063; H02K 5/225; H02K 11/0094; F16H 25/20; F16H 35/18;
(Continued)

(56) References Cited

U.S. PATENT DOCUMENTS 2,778,344 A * 1/1957 Compton ................ F01C 13/00
74/89.41
4,790,201 A * 12/1988 Gheddo ............... B62D 33/067
74/89.37
(Continued)

FOREIGN PATENT DOCUMENTS

| DE | 3527677 A1 | 2/1987 |
| EP | 1 404 170 A2 | 3/2014 |
| WO | 2012/083951 A1 | 6/2012 |

OTHER PUBLICATIONS

International Search Report for corresponding International Application No. PCT/DK2015/000045 dated Mar. 2, 2016.
(Continued)

*Primary Examiner* — Thanh Lam
(74) *Attorney, Agent, or Firm* — Renner, Otto, Boisselle and Sklar, LLP

(57) ABSTRACT

Linear actuator system comprising a linear actuator and at least one box, such as a control box containing a control and possibly also a mains-based power supply or a battery box with a rechargeable battery pack. The linear actuator system further comprises a fastening means for the box, wherein the fastening means is constituted by an elongated item with a rectangular outline and a square cross-section. The box has a groove for receiving the fastening means. The fastening means and the groove are constituted with mutually interacting releasable locking connections. The fastening means can be designed as an independent item that can be fastened where the box is to be placed. The fastening means can also be used to interconnect two or more boxes by fastening the fastening means to a box. Alternatively, the fastening means can be formed as an integral part of the box. The fastening means can also be used to fasten a box to the outer tube on a linear actuator by fastening or, more expediently, by the fastening means being designed as an integral part of a
(Continued)

Figure 1:
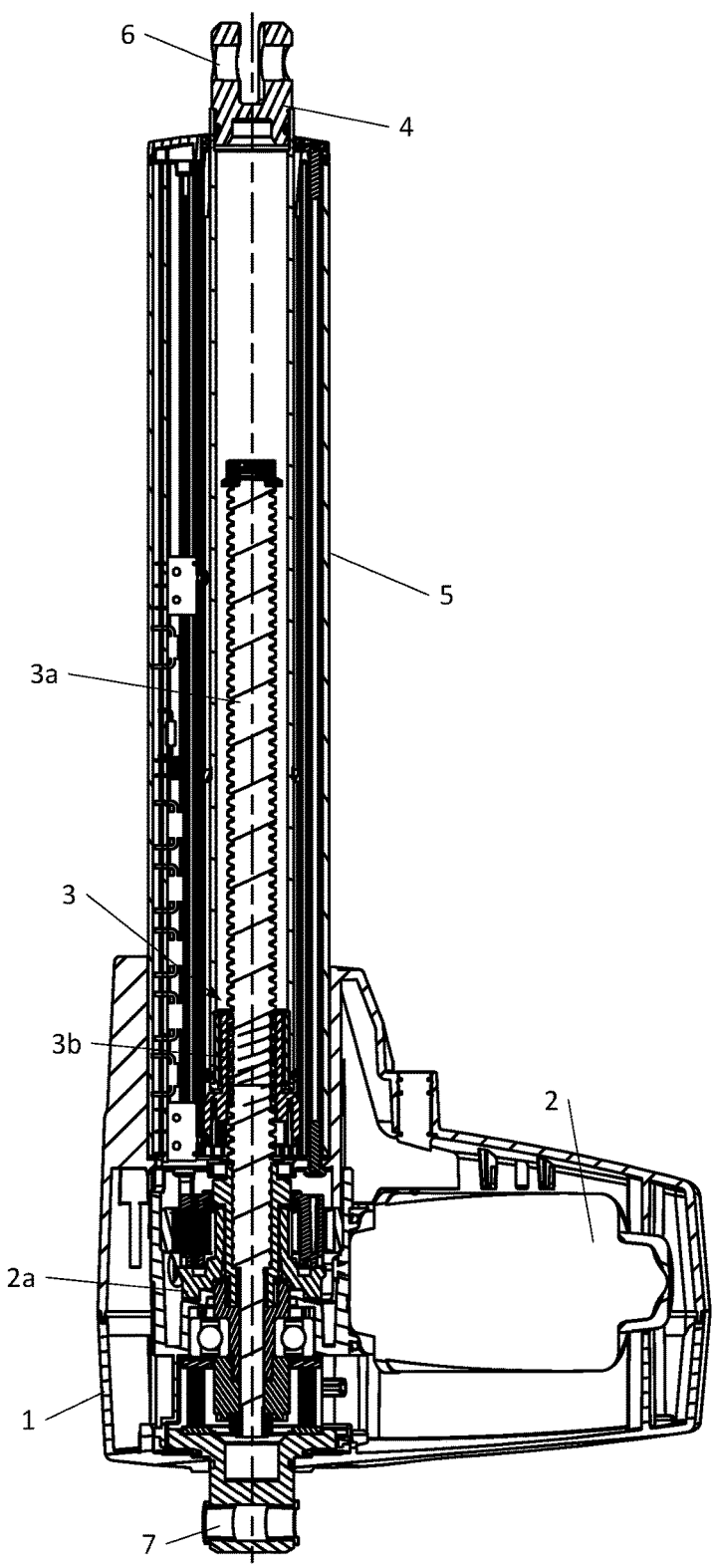

tubular mounting bracket which is slid over an outer tube on the linear actuator.

12 Claims, 19 Drawing Sheets

(51) Int. Cl.
    *F16H 25/20*     (2006.01)
    *H02K 5/22*     (2006.01)
    *H02K 11/00*     (2016.01)
    *H05K 5/02*     (2006.01)
    *H02K 11/33*     (2016.01)
    *F16H 35/18*     (2006.01)

(52) U.S. Cl.
    CPC ........... *H02K 7/06* (2013.01); *H02K 11/0094* (2013.01); *H02K 11/33* (2016.01); *H05K 5/0204* (2013.01); *F16H 2025/2031* (2013.01); *F16H 2025/2084* (2013.01); *H05K 5/0239* (2013.01)

(58) Field of Classification Search
    CPC .... F16H 2025/2031; F16H 2025/2084; H05K 5/0239; H05K 5/0204
    USPC .......................................... 310/37, 15, 71, 83
    See application file for complete search history.

(56) References Cited

U.S. PATENT DOCUMENTS

| | | |
|---|---|---|
| 4,791,244 A | 12/1988 | Taybl |
| 5,358,135 A | 10/1994 | Robbins et al. |
| 6,409,042 B1 | 6/2002 | Hirano et al. |
| 8,047,867 B2 | 11/2011 | Wu |
| 9,018,813 B2 * | 4/2015 | Randlov .................. A47B 9/04 108/20 |
| 2004/0106331 A1 | 6/2004 | Hoegener et al. |
| 2005/0264109 A1 * | 12/2005 | Abrahamsen ........... F16H 25/20 310/20 |
| 2009/0065226 A1 * | 3/2009 | John .................... B25D 11/005 173/6 |
| 2013/0313907 A1 | 11/2013 | Wu |
| 2017/0047816 A1 * | 2/2017 | Wu ......................... F16H 25/20 |
| 2018/0266530 A1 * | 9/2018 | Alfano ................ F16H 25/2015 |

OTHER PUBLICATIONS

Written Opinion of the International Searching authority for corresponding International Application No. PCT/DK2015/000045 dated Mar. 2, 2016.

* cited by examiner

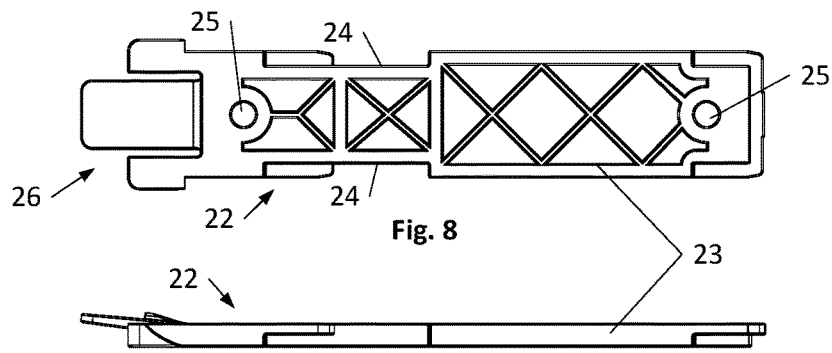
Fig. 8
Fig. 9
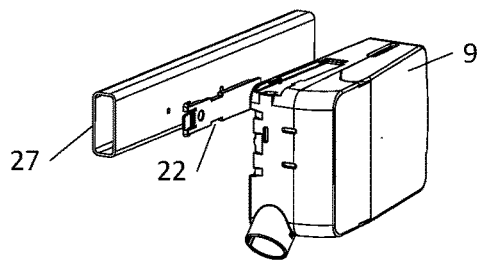
Fig. 10
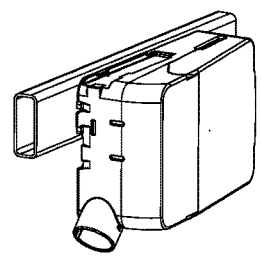
Fig. 11
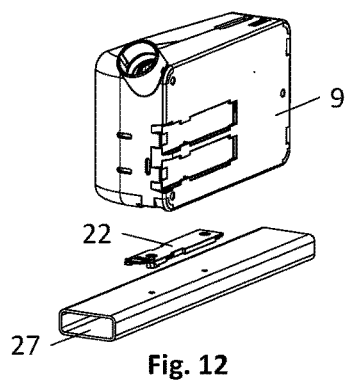
Fig. 12
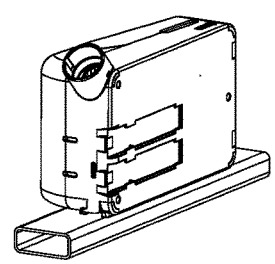
Fig. 13
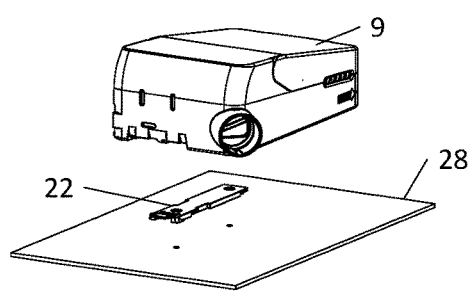
Fig. 14
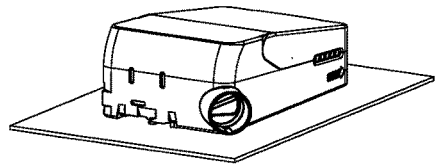
Fig. 15

LINEAR ACTUATOR SYSTEM

This application is a national phase of International Application No. PCT/DK2015/000045 filed Nov. 12, 2015 and published in the English language, which claims priority to DK PA 2014 00660 filed on Nov. 12, 2014.

The present invention relates to a linear actuator system comprising a linear actuator with a housing, an electric motor with a transmission, a spindle unit), an activation element in connection with the spindle unit and wherein the electric motor via the transmission drives the spindle unit), such that the activation element moves back and forth depending on the direction of rotation of the electric motor, and further comprising a box, such as a control box containing a controller and possibly also a mains-based power supply or a battery box with a battery pack, and wherein the box can be secured to an item.

A linear actuator is known from U.S. Pat. No. 8,047,867 B2 to T-Motion, in which a control box can be mounted in the angle between the housing with the motor and an outer tube standing perpendicularly from the side of the housing at its front end. The control box is secured to the linear actuator, both with its rear end and with the side that faces towards the outer tube. For attaching the rear end of the control box, this and the side of the housing, which it faces towards, is provided with a dovetail connection, such that the control box, when displaced from the rear end of the housing towards the outer tube, is hitched to the housing. The side of the housing is secured by means of a tubular mounting bracket, which can be slid over the outer tube of the linear actuator. The side of the control box and the side of the mounting bracket, which faces towards this, are also furnished with a dovetail connection such that the control box is secured to the outer tube when the mounting bracket is slid over this. When space is limited, it can be difficult to find enough room to slide the control box sideways from the rear end of the housing towards the outer tube. In addition, the two dovetail connections also entail a complication of the mould tools. The control box has a loose sliding cover, the position of which when mounted is determined by a stop collar on the sliding cover, which interacts with the front end of the tubular mounting bracket and is locked with a hook on the control box at one side thereof, and is in engagement with a slot at one side of the sliding cover.

The purpose of the invention is to provide a linear actuator system, wherein a control box or other box can be secured independently of the linear actuator.

According to the invention, this is achieved by designing the linear actuator system as stated in claim 1, wherein the linear actuator system further comprises a fastening means for the box, wherein the fastening means is comprised of an elongated item with a rectangular outline and a square cross-section and that the outside of the box is provided with a groove for receiving the fastening means and that the fastening means and the groove are constituted with mutually interacting releasable locking connections and that the fastening means is designed so that it can be secured to an item. The fastening means can be designed as a separate item that can be fastened where the box is to be placed. The fastening means can also be used to interconnect two or more boxes by fastening the fastening means to a box. Alternatively, the fastening means can be designed as an integral part of the box. The fastening means can also be used to fasten a box to the outer tube of a linear actuator by fastening or, more expediently, in that the fastening means are designed as an integral part of a tubular mounting bracket which is moved over an outer tube on the linear actuator.

In a special embodiment of the interacting fastening means, there is an indentation in each side of the rib of the fastening means, located partway in, and there are protrusions in the sides of the groove on the box, one pair at the front end of the groove and one pair located partway in along the groove and wherein the shape of the protrusions on the groove corresponds to the indentations in the rib of the fastening means. When fastening the box, it is with the groove slid over the rib on the fastening means, such that one pair of protrusions reaches into the indentations on the rib of the fastening means. The box is then displaced, whereby the rib on the fastening means grips behind the protrusions in the groove and retains the box on the fastening means. In a further development, there are interacting snap-locking connections in the bottom of the groove on the box and in the rib on the fastening means, whereby the control box is secured against being displaced in the groove and thus also from unintended detachment.

In an embodiment, the tubular mounting bracket for mounting a box on the outer tube of a linear actuator has an axially extending slit, preferably throughout the tubular portion of the mounting bracket, and the rib on the fastening means extends on both sides of the slit. The axially extending slit facilitates the securing of the mounting bracket on the outer tube of the linear actuator, as the tubular portion of the mounting bracket can expand slightly and thereby compensate for manufacturing tolerances and some small insecurities during the securing of the mounting bracket. When the box is subsequently fastened onto the mounting bracket, the slit is contracted such that the tubular portion of the mounting bracket tightens around the outer tube on the linear actuator, thereby ensuring a good securing.

In a further embodiment, the box is provided with a number of grooves for receiving the fastening means, such that the box can be fastened in different locations with respect to the fastening means. This is particularly important when fastening a control box on a linear actuator, as the control box can thus be mounted in various ways in relation to the linear actuator. For example, the box can be designed with a groove on a side and two grooves on the underside. Thus, it is possible to mount a control box level with the linear actuator or standing upright or otherwise adapt the placing to the present conditions. It is obvious that the mounting possibilities are not limited to these options. Naturally, the box can be mounted in other ways by placing the grooves differently.

In the embodiment, where the fastening means is formed as a separate element, it can be fitted with means adapted to the relevant base on which the fastening means shall be mounted. For example, the fastening means can be mounted with an adhesive or Velcro®. In an embodiment, the fastening means is formed with a hole at least at each end for a screw, bolt, nail or similar fastening means, which in most cases will provide a secure fastening.

In a further embodiment the linear actuator system comprises a control panel or hand control where a least one groove is designed on the rear side for mounting the control panel or hand control by means of the fastening means. In connection with adjustable beds such as beds where the back rest and leg rest could be adjusted by means of a linear actuator system, the control panel or wireless hand control could then easily be mounted on the bed. Loose control panels and hand controls often poses a problem in regard to where to place it and some times they also get lost. This problem is solved by this further embodiment and further it is possible to place the control panel and hand control within reach.

Figure 2:
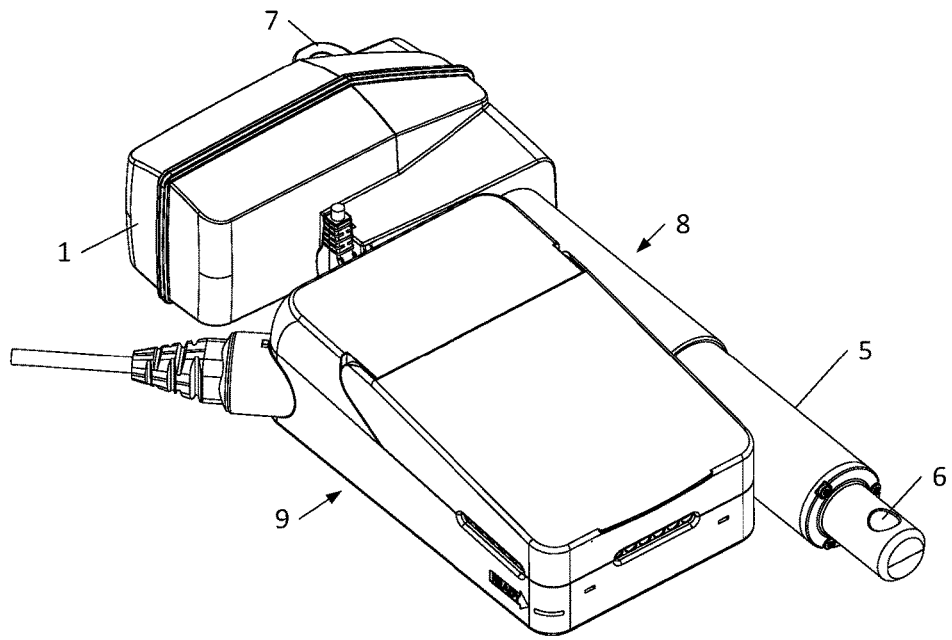
Figure 3:
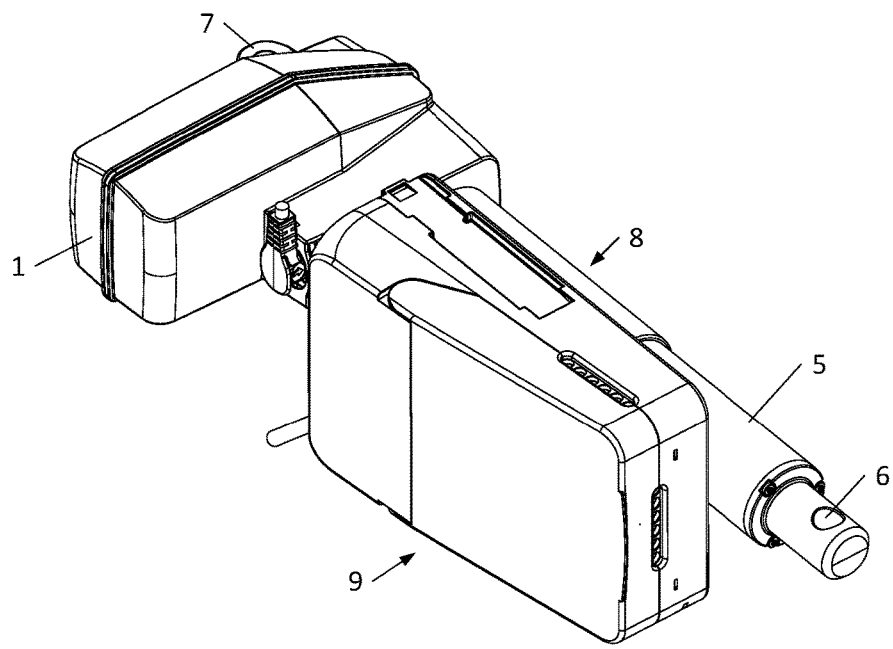
Figure 4:
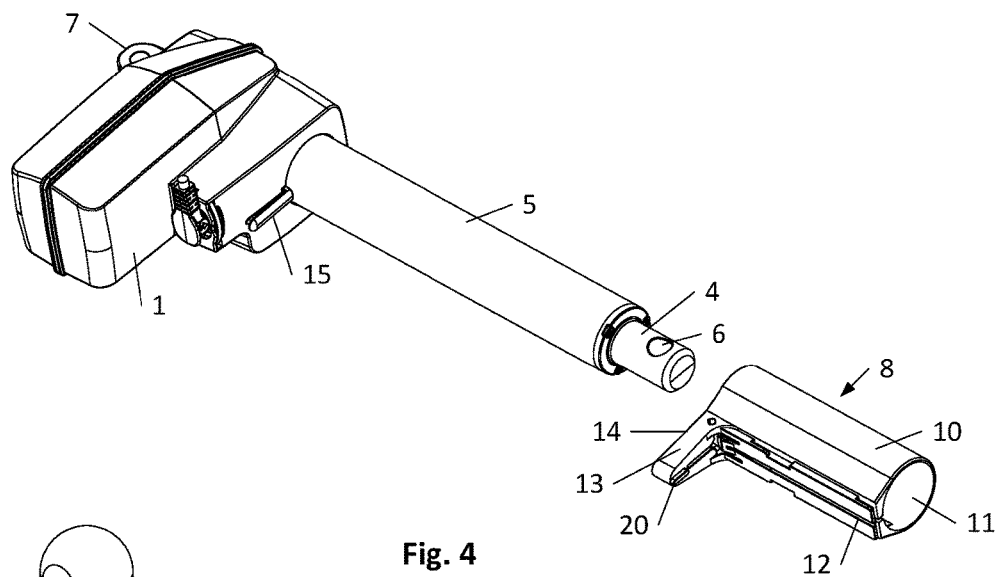
Figure 6:
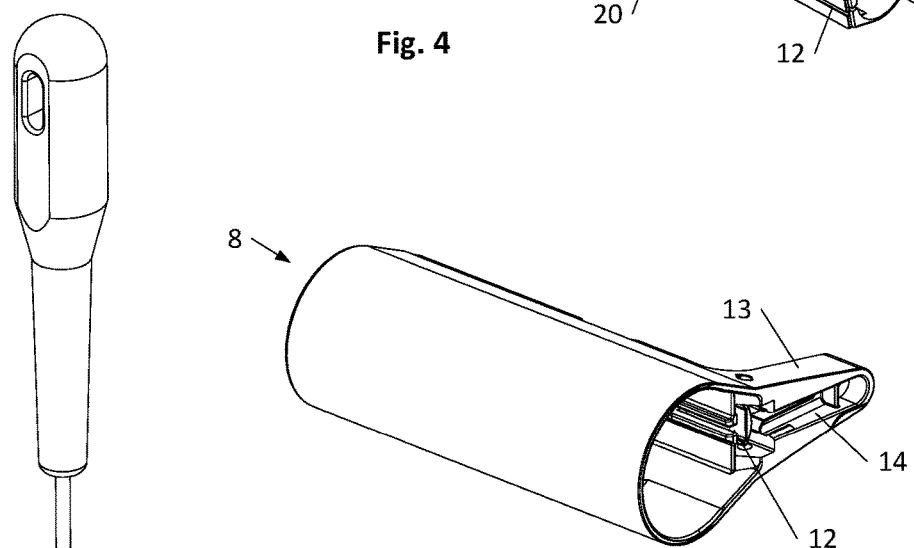
Figure 5:
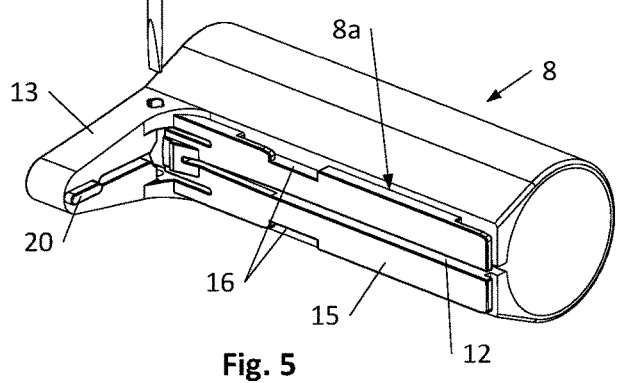
Figure 7:
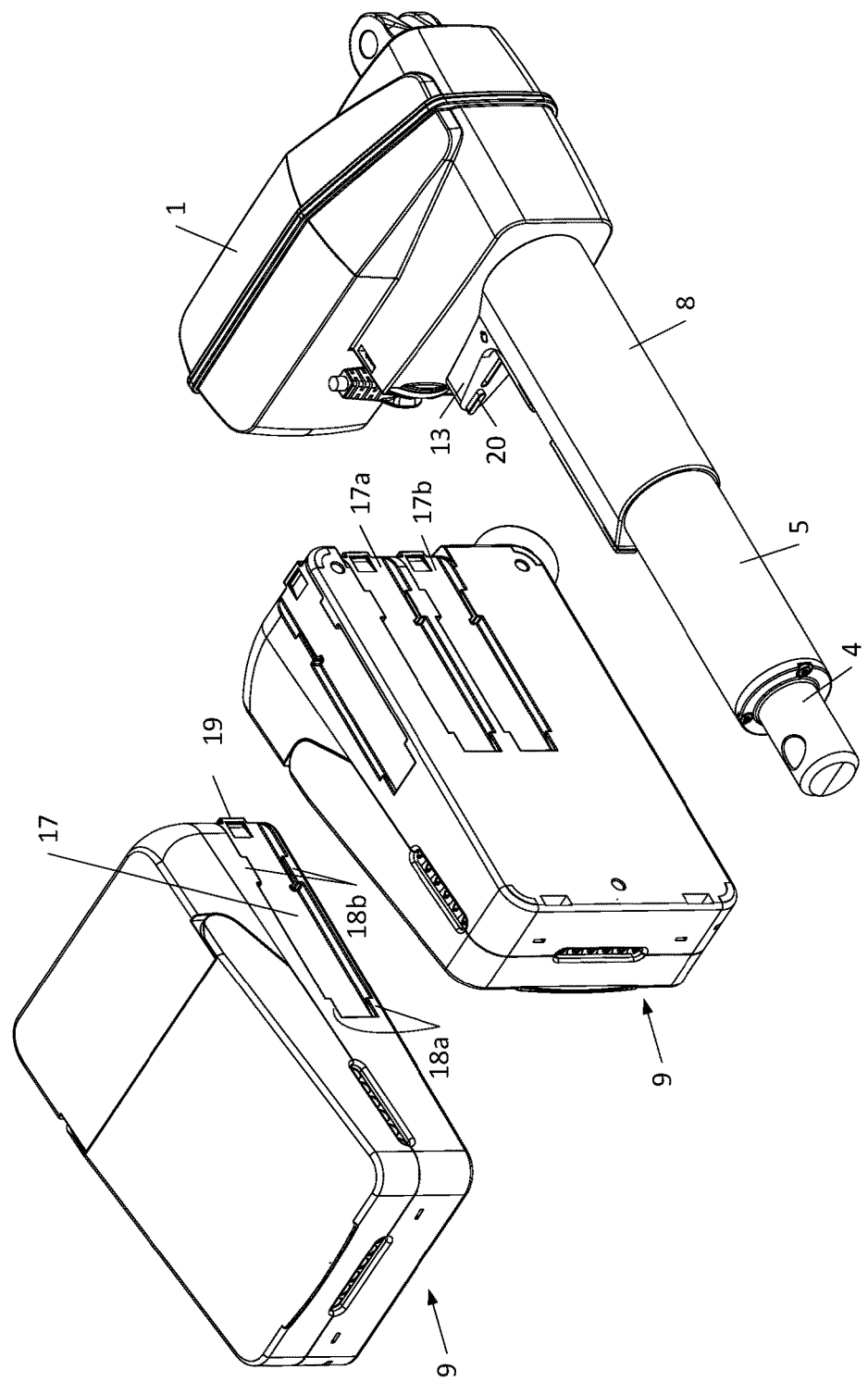
Figure 16:
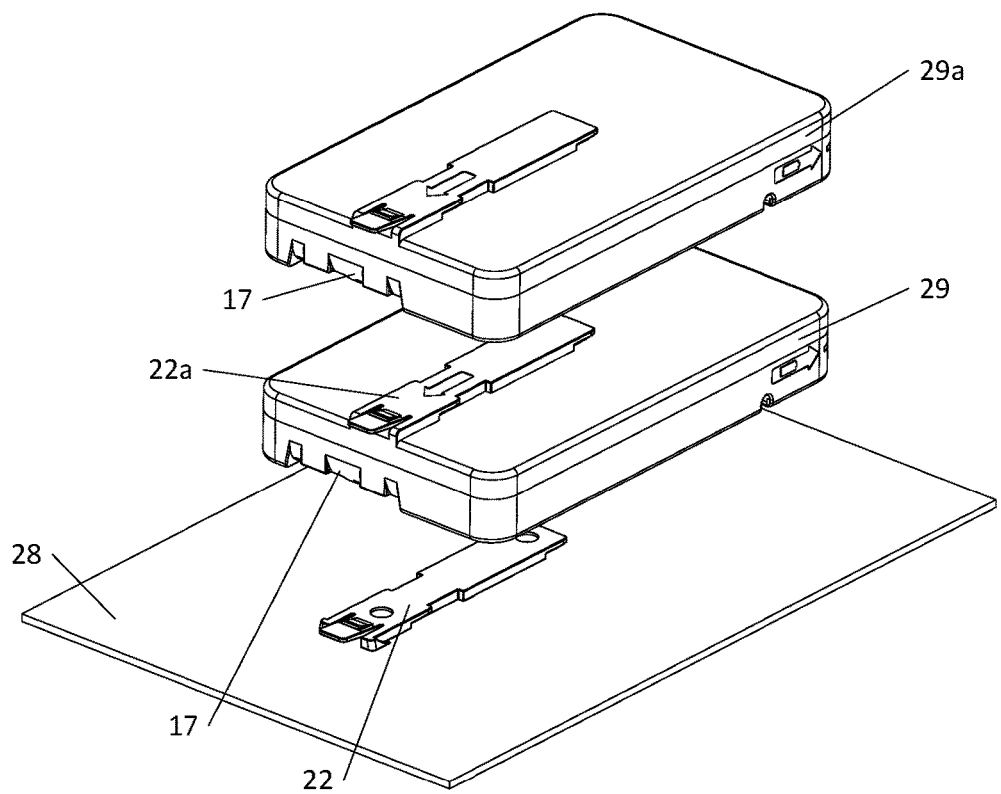
Figure 17:
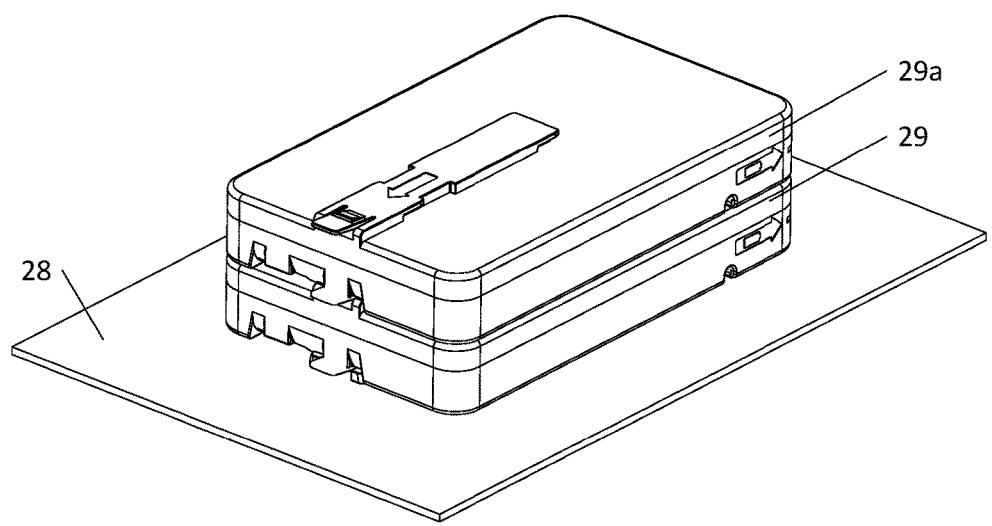
Figure 18:
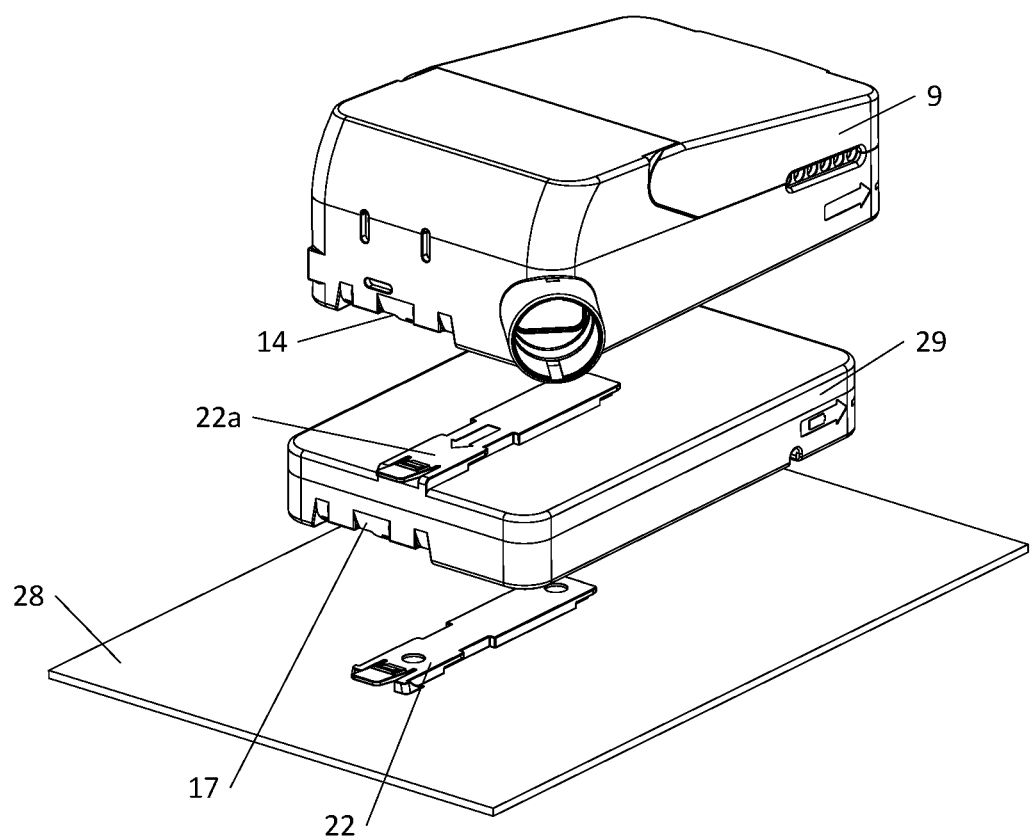
Figure 19:
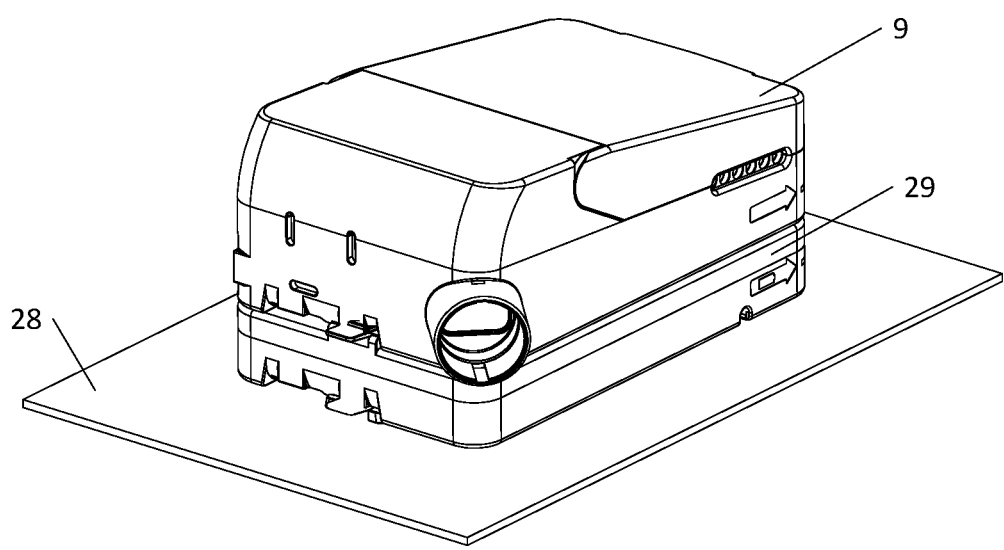
Figure 20:
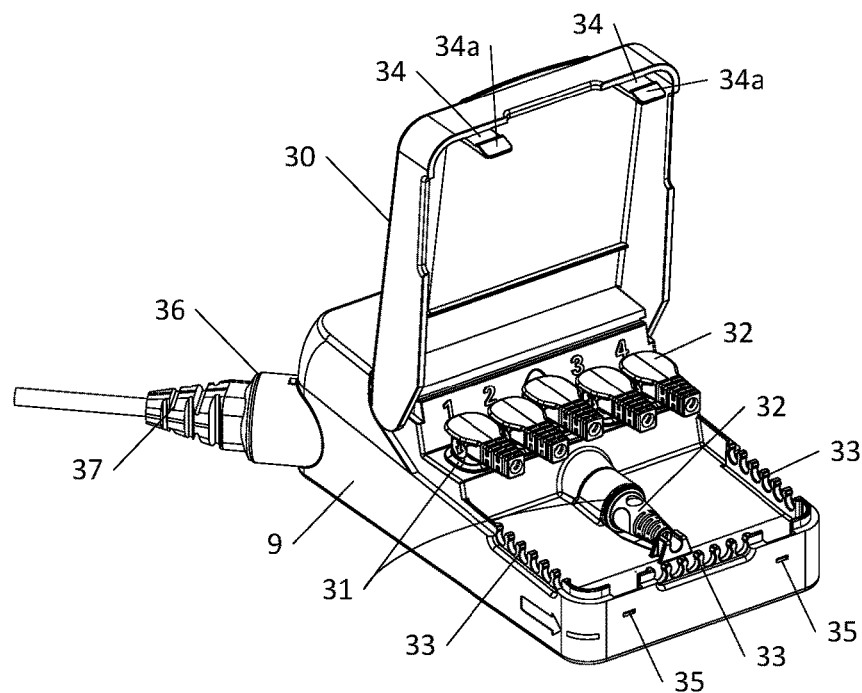
Figure 21:
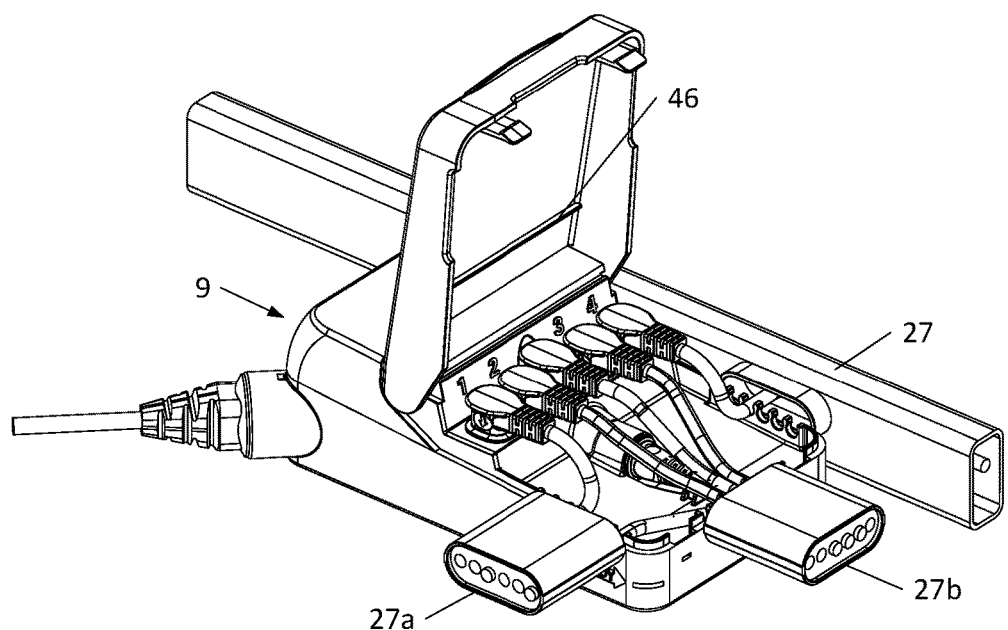
Figure 22:
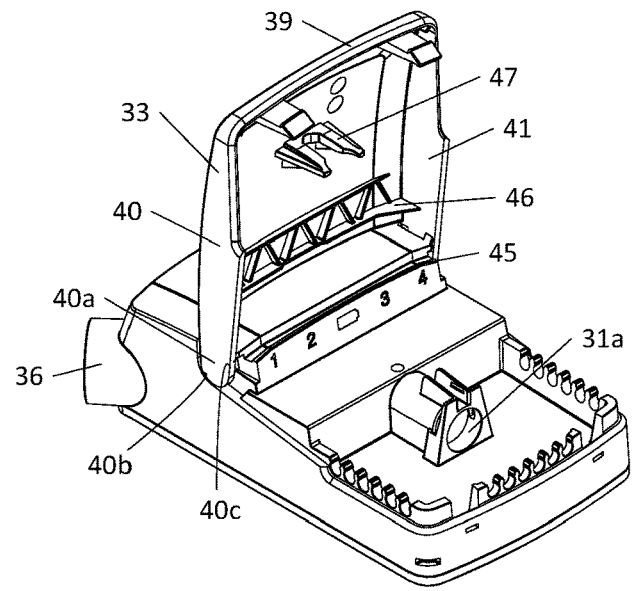
Figure 23:
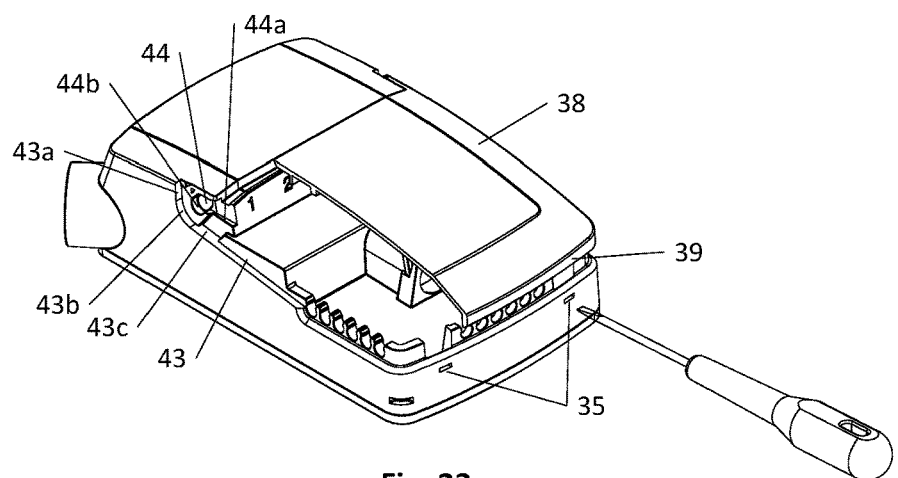
Figure 24:
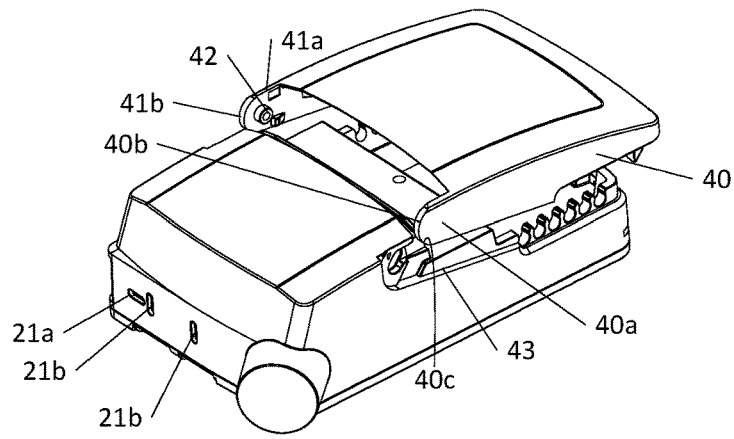
Figure 25:
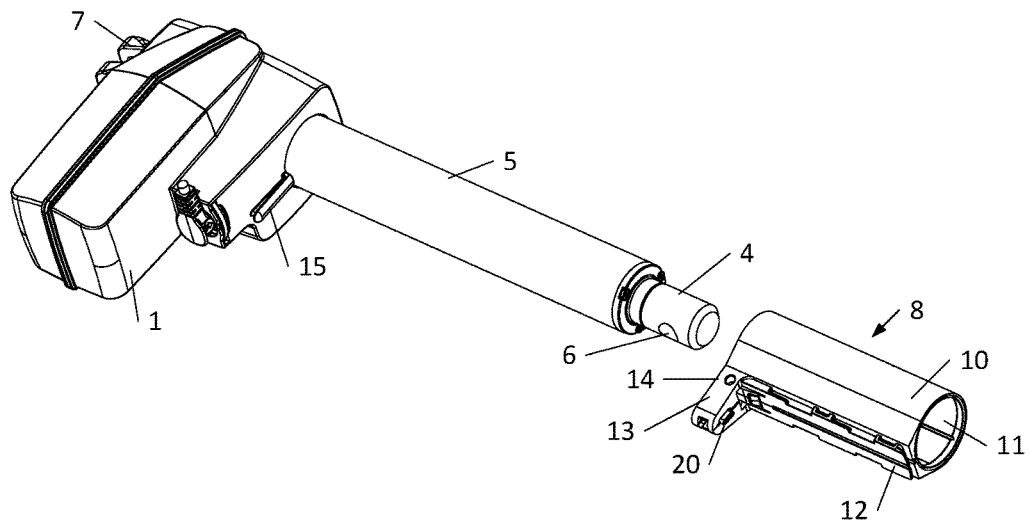
Figure 26:
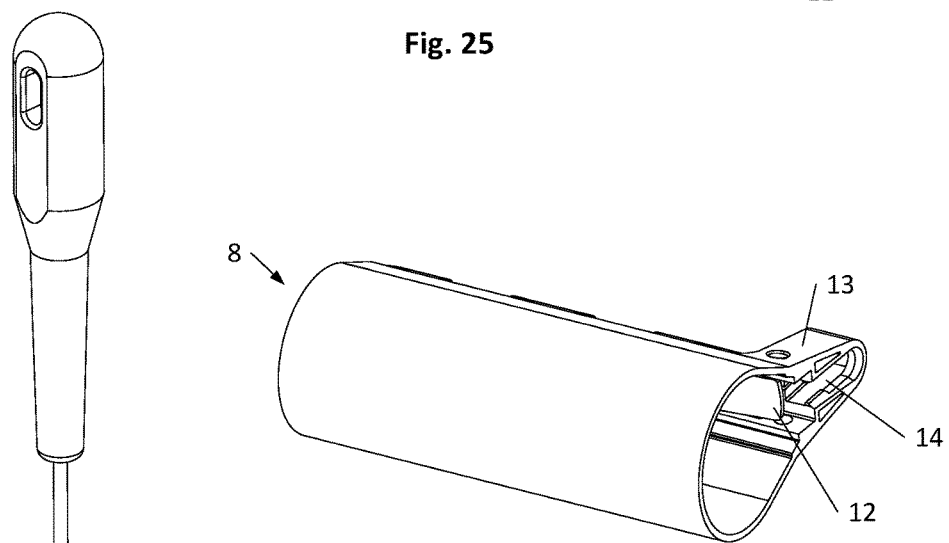
Figure 27:
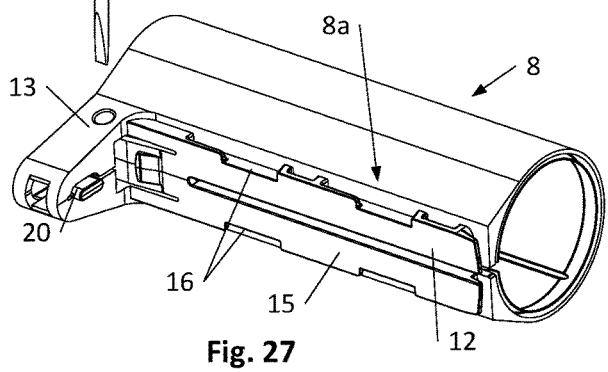
Figure 28:
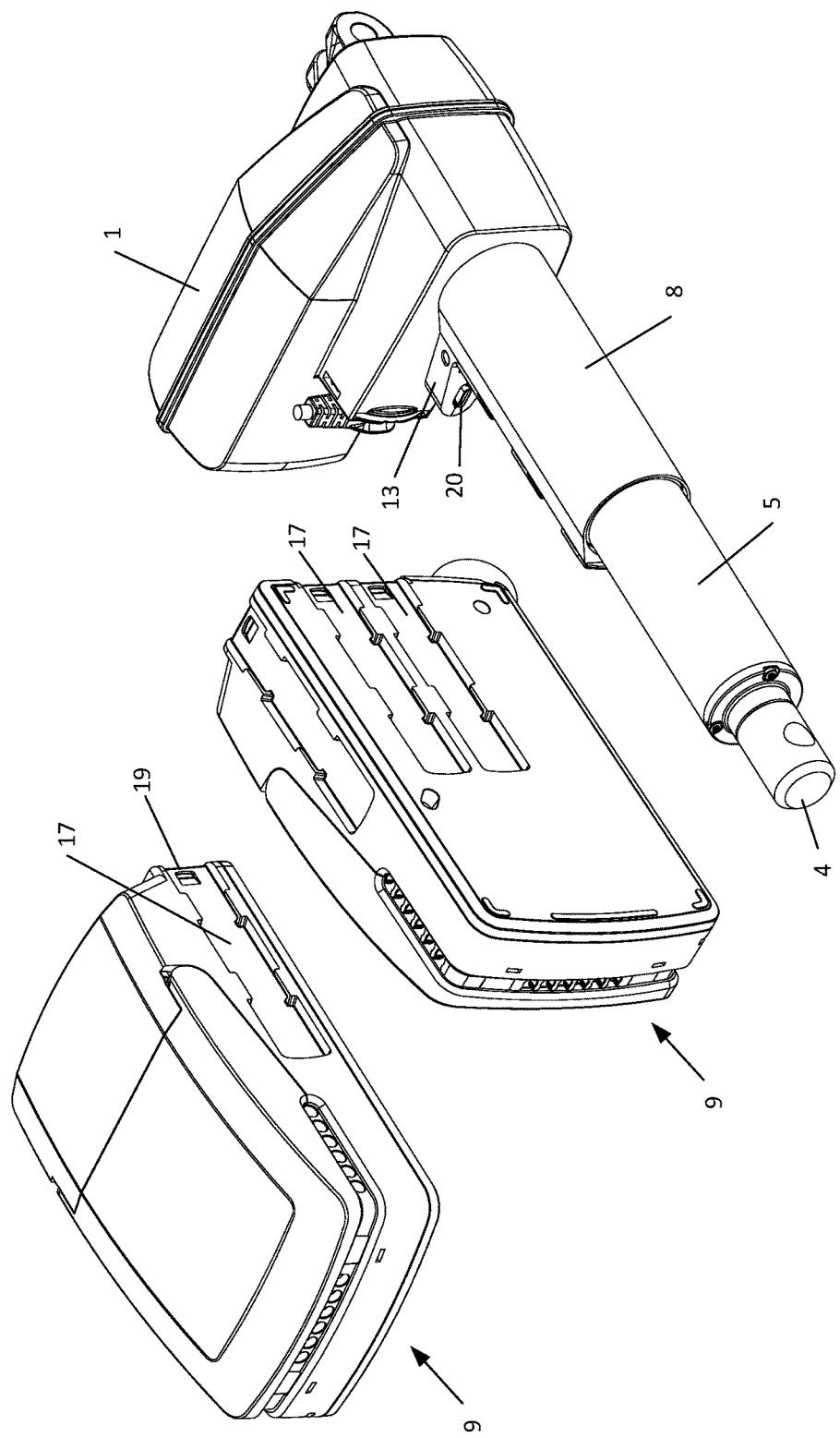
Figure 29:
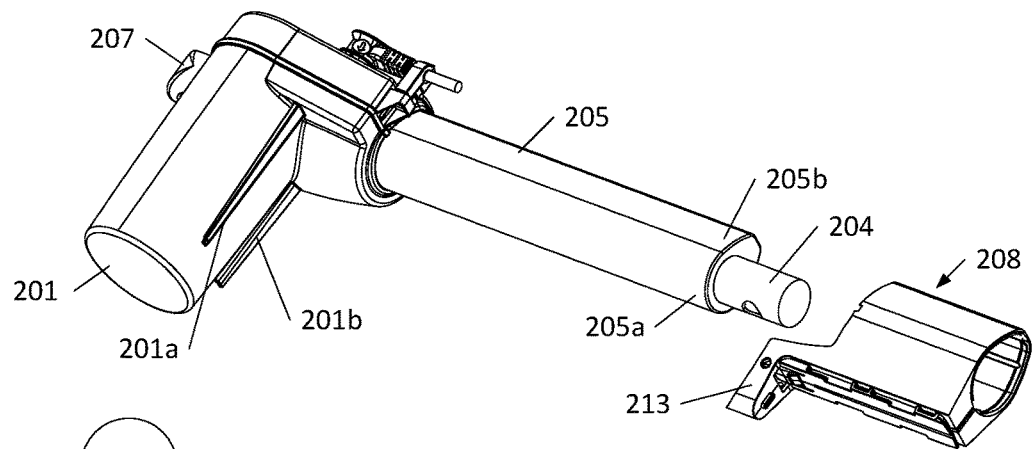
Figure 30:
Figure 30:
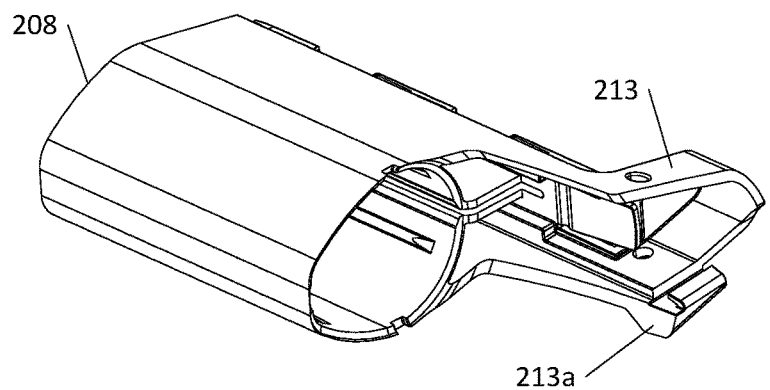
Figure 31:
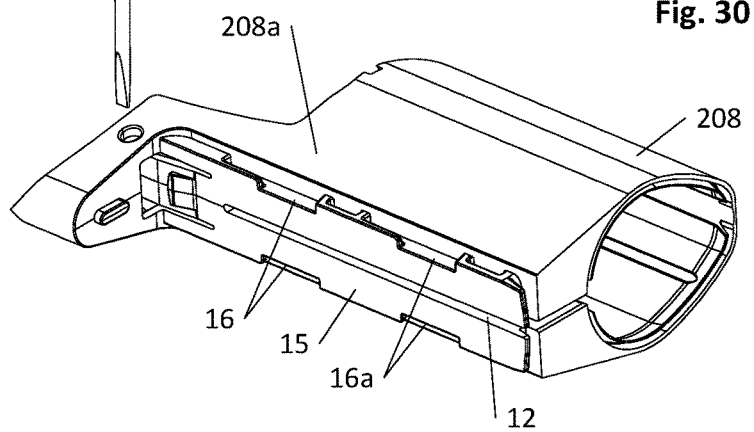
Figure 32:
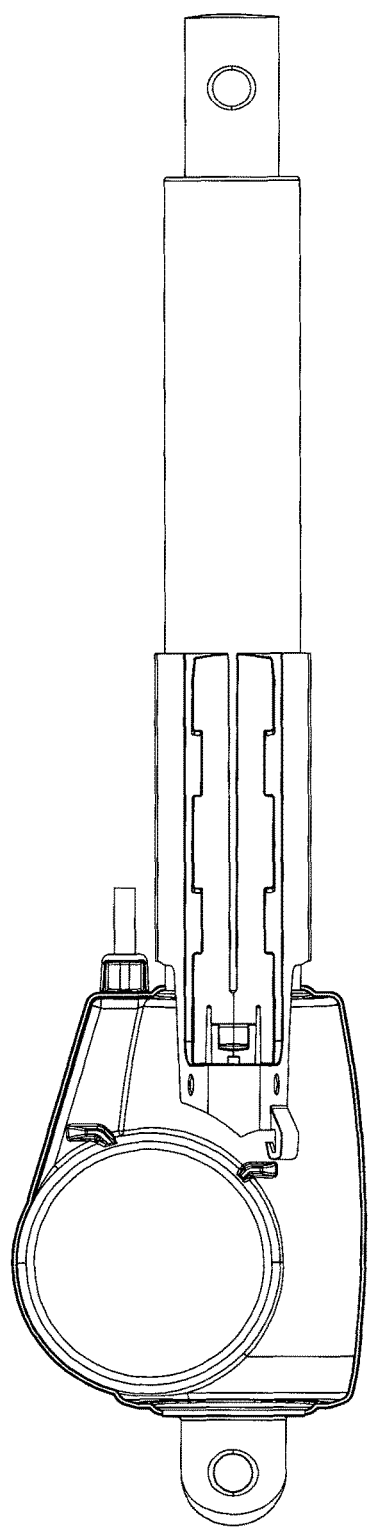
Figure 33:
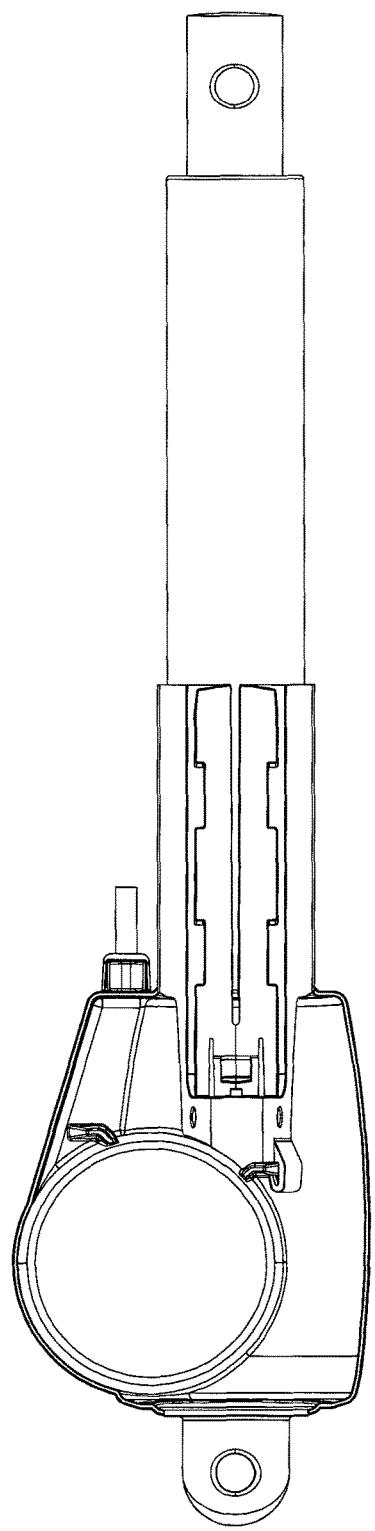
Figure 34:
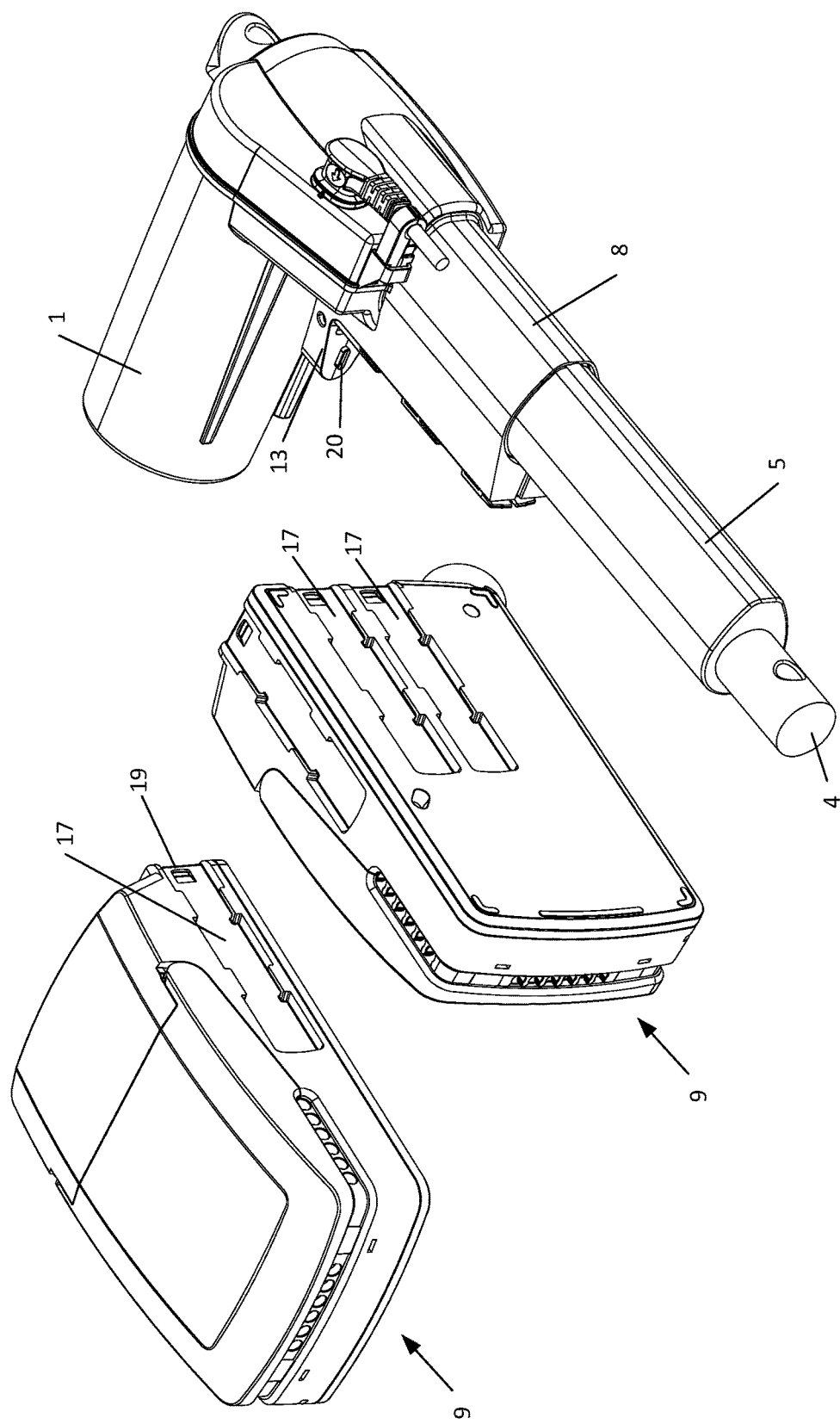
Figure 35:
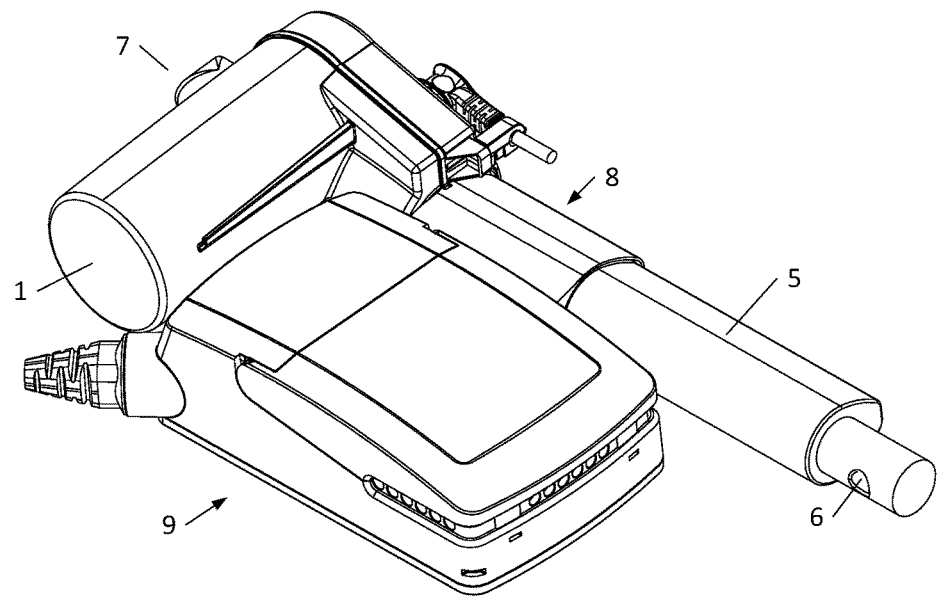
Figure 36:
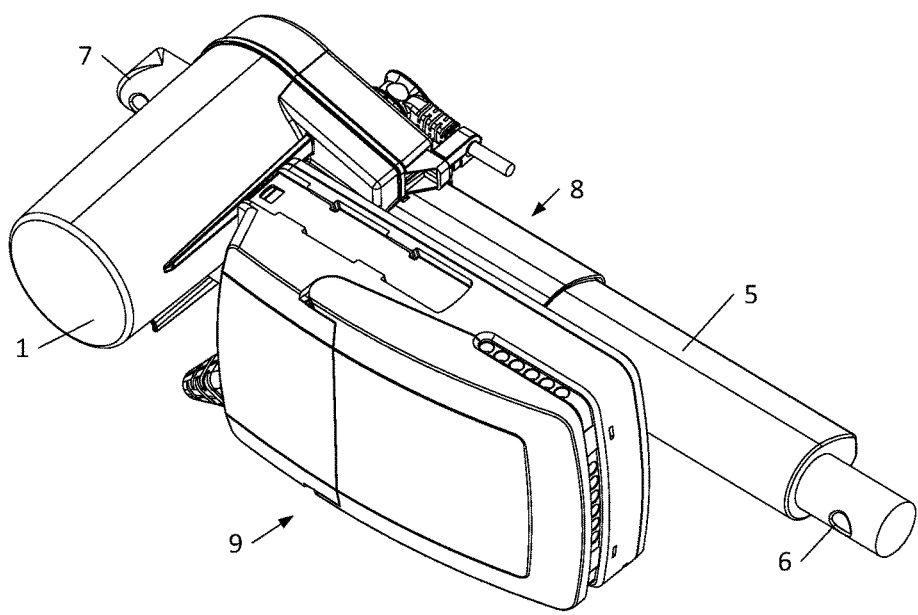
Figure 37:
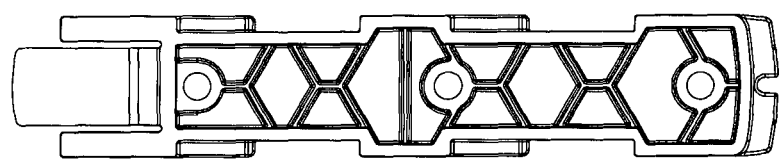
Figure 38:
Figure 39:
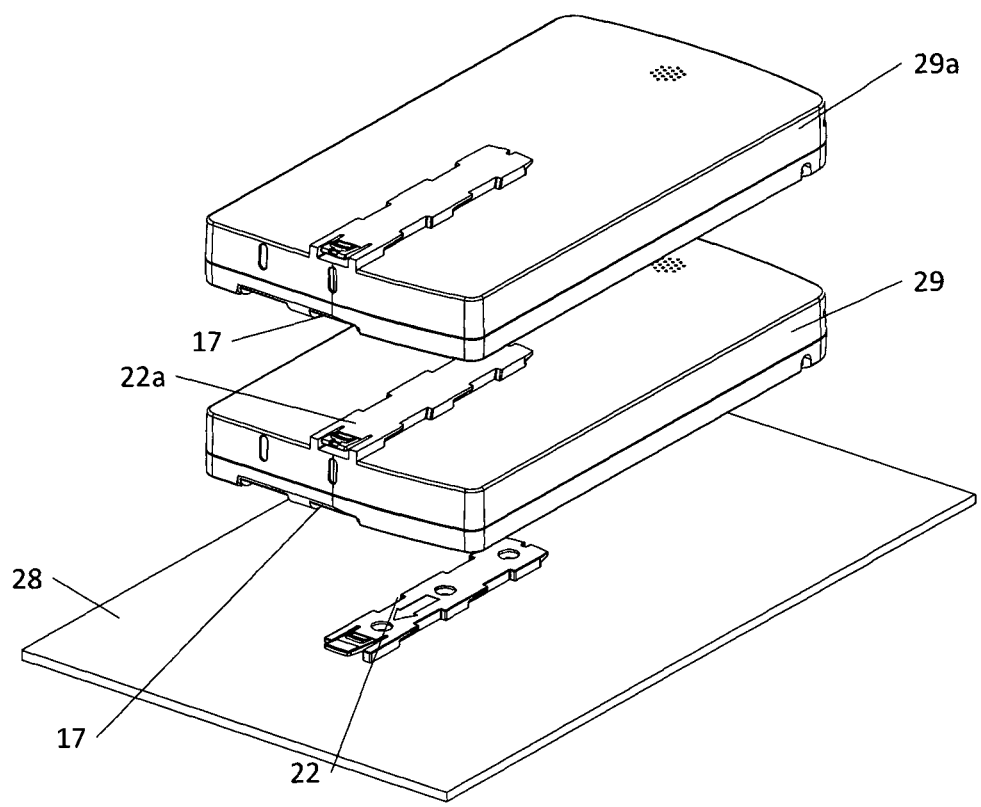
Figure 40:
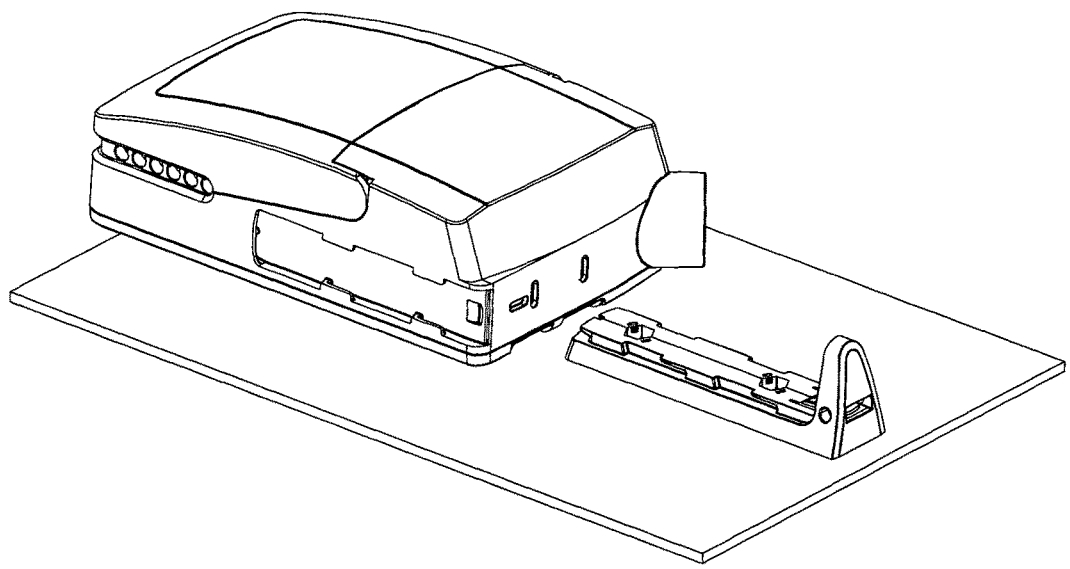
Figure 41:
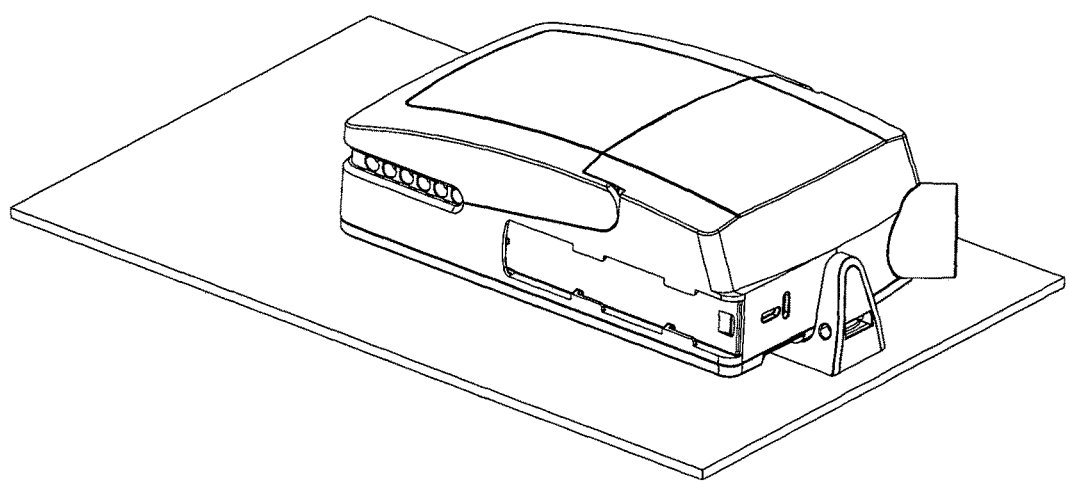
Figure 42:
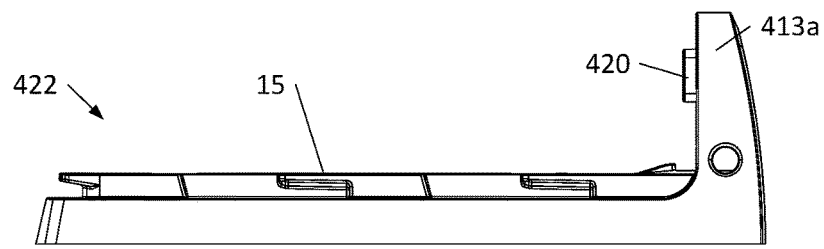
Figure 43:
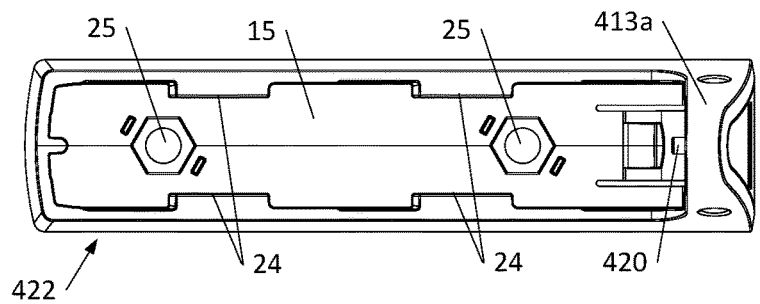
Figure 44:
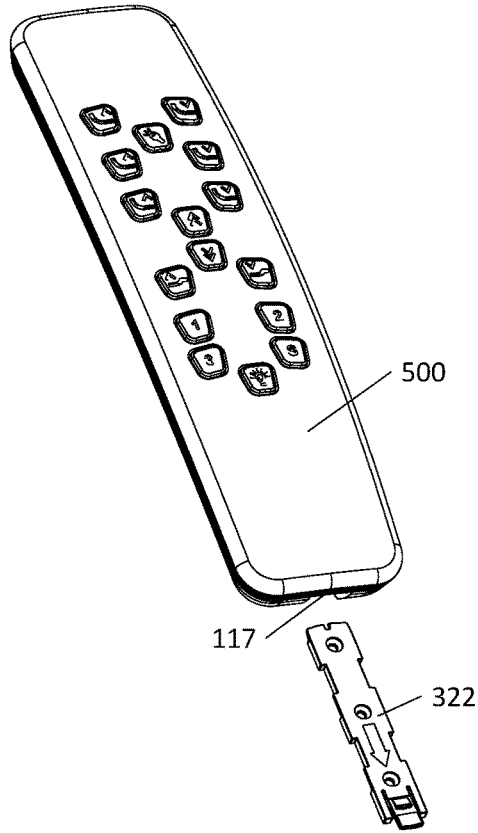
Figure 45:
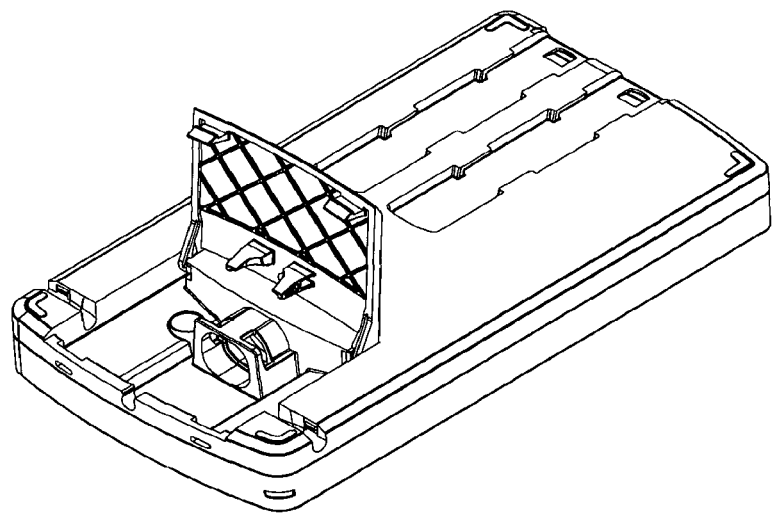
Figure 46:
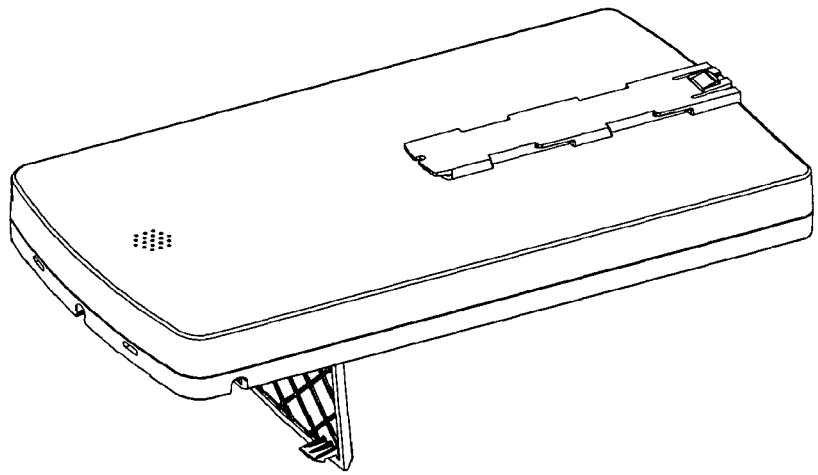
Figure 47:
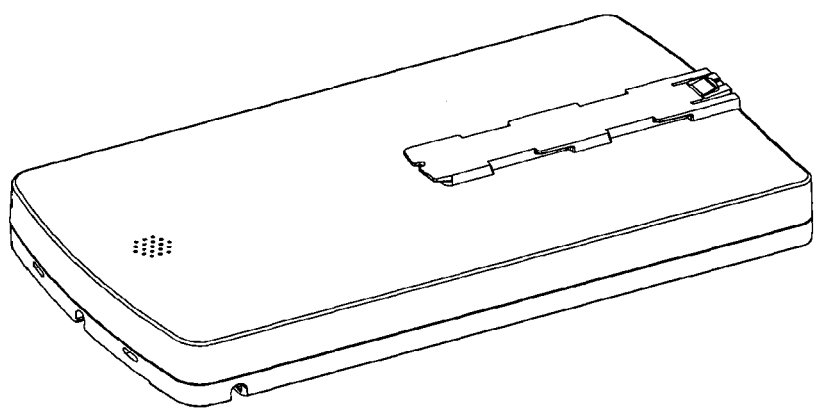

The invention is described in more detail below, with reference to the examples illustrated on the accompanying drawings. The drawing show:

FIG. 1 a longitudinal section through a linear actuator,

FIG. 2 a linear actuator mounted with a box placed horizontally,

FIG. 3 a linear actuator mounted with a box placed edgeways,

FIG. 4 a linear actuator and a mounting bracket for insertion over an outer tube on the actuator, FIG. 5 the mounting bracket viewed from the front, FIG. 6 the mounting bracket viewed from behind, FIG. 7 a linear actuator and box placed edgeways as well as a box placed horizontally, FIG. 8 a mounting bracket for a box, where the mounting bracket is viewed from above, FIG. 9 the mounting bracket in FIG. 8 viewed from the side, FIG. 10 a box placed edgeways, ready for mounting with the bottom on a tubular cabling duct, FIG. 11 the box shown mounted on the tubular cabling duct, FIG. 12 a box placed edgeways, ready for mounting with the side on a tubular cabling duct, FIG. 13 the box shown mounted on the tubular cabling duct, FIG. 14 a box placed horizontally, ready for mounting on a flat base, FIG. 15 the box mounted on the flat base, FIG. 16 two boxes of another type placed horizontally, where the lower box with the bottom is ready for mounting on a flat base and the second box is ready to be mounted on top of the lower box, FIG. 17 the two boxes mounted on top of each other, where the lower box is mounted on the flat base, FIG. 18 a box of the first type shown in FIG. 2-15, ready for mounting on top of a box of the second type shown in FIG. 16-17, and where the box of the second type is shown ready for mounting on a level base, FIG. 19 the two boxes mounted on top of each other, where the lower box is shown mounted on the level base, FIG. 20 the box of the first type, shown with open cover, FIG. 21 the box of the first type, shown with open cover and with the side mounted on a cabling duct and where the routing of cables is shown in the box, FIG. 22 the box of the first type, shown with open cover, FIG. 23 the box of the first type, shown with closed cover, and where one side of the cover has been cut away, FIG. 24 the box of the first type, shown with loose cover ready to be placed on the box, FIG. 25 the linear actuator in FIGS. 2-4 and 7 and a further embodiment of the mounting bracket for insertion over the outer tube on the actuator, FIG. 26 the mounting bracket viewed from the front, FIG. 27 the mounting bracket viewed from behind, FIG. 28 the linear actuator and box placed edgeways as well as a box placed horizontally, FIG. 29 a linear actuator and an embodiment of the mounting bracket for insertion over an outer tube on the linear actuator, FIG. 30 the mounting bracket viewed from the front, FIG. 31 the mounting bracket viewed from behind, FIG. 32 the linear actuator seen from the side with the mounting bracket inserted over the outer tube on the linear actuator, just before reaching its locked position, FIG. 33 the same as in FIG. 32 but where the mounting bracket is in its final locked position, FIG. 34 the linear actuator and control box placed edgeways as well as a control box placed horizontally, FIG. 35 the linear actuator mounted with a control box placed horizontally, FIG. 36 the linear actuator mounted with a control box placed edgeways, FIG. 37 a further embodiment of the mounting bracket for a box, where the mounting bracket is viewed from above, FIG. 38 the mounting bracket in FIG. 37 viewed from the side, FIG. 39 two boxes of another type placed horizontally, where the lower box with the bottom is ready for mounting on a flat base and the second box is ready to be mounted on top of the lower box, FIG. 40 a yet further embodiment of the mounting bracket fixed on a flat base and control box ready to be mounted on the flat base, FIG. 41 the control box mounted on the flat base, FIG. 42 the mounting bracket in FIG. 40 seen directly from the side, FIG. 43 the mounting bracket in FIG. 42 seen directly from above, FIG. 44, a hand control designed for mounting with a mounting bracket shown in FIG. 37-38, FIG. 45, a further embodiment of the box seen from one side, the box having a lid which is shown in its open state, FIG. 46, the box in FIG. 45, seen from the other side, and FIG. 47, the box seen as in FIG. 46 but with the lid closed.

The main components of the linear actuator outlined in FIG. 1 are comprised of a housing 1, a reversible electric motor 2, a transmission 2a, a spindle unit 3 with a spindle 3a, on which there is a spindle nut 3b, an activation element 4 in the form of a tube section, which with a rear end is secured to the spindle nut, an outer tube 5, which with a rear end is secured to the housing 1, and where the outer tube 5 surrounds the spindle unit 3 and the activation element 4. The outer tube 5 acts as a guide for the activation element 4 and the spindle nut 3b. It further comprises a front mounting 6 in the front end of the activation element 4, and a rear mounting 7 in the rear end of the housing, where the front mounting 6 and the rear mounting 7 serve for mounting the linear actuator in the structure wherein the linear actuator shall be built in When the electric motor 2 is activated the spindle 3a is set into rotation, whereby the spindle nut 3b and the connected activation element 4 will move outwards on the spindle 3a or retract inwards on the spindle 3a, depending on the direction of rotation of the reversible electric motor 2.

FIG. 2 of the drawing shows a perspective view of the linear actuator in which a box 9 is mounted in the angle between the housing of the linear actuator 1 and the outer tube 5 by means of a mounting bracket 8, more specifically a control box containing a controller for a number of linear actuators and a mains-based power supply. The box 9 is mounted here so that it is level with the housing 1 and the outer tube 5 of the linear actuator. However, the box 9 can also be mounted such that it stands upright, as shown in FIG. 3.

As shown in FIG. 4-6, the mounting bracket 8 comprises a tubular portion 10, where the inside diameter 11 has a circular cross-section, adapted such that the mounting bracket 8 with the tubular portion 10 can be slid over the outer tube 5, which also has a circular cross-section. The tubular portion 10 of the mounting bracket 8 has an axially extending slit 12, which makes it easier to slide the mounting bracket 8 over the outer tube 5, as the tubular portion 10 of the mounting bracket 8 can expand slightly due to the axially extending slit 12. Due to the axially extending slit 12, the inside diameter 11 in the tubular portion 10 can be adapted, such that the mounting bracket 8 with the tubular portion 10 fits tightly around the outer tube 5. There is a radially protruding arm 13 at the rear end of the mounting bracket 8. On the rear side, i.e. the side facing towards the linear actuator, there is a groove 14 running in the longitudinal direction of the arm 13. When the mounting bracket 8 is slid fully against the front end of the housing 1 on the linear actuator, the mounting bracket 8 with the groove 14 is slid over a protruding rib 15 with a shape corresponding to the groove on the linear actuator housing 1. This secures the mounting bracket 8 so that it cannot rotate around the outer tube 5. The groove 14 and the protruding rib 15 on the housing 1 are further designed with snap locks, which retain the mounting bracket 8 in the axial direction, so that the mounting bracket 8 does not unintentionally slide out of the outer tube 5 on the linear actuator. The longitudinal slit 12 in the tubular portion 8 continues partway out in the arm 13 on the mounting bracket 8, such that the arm does not counteract the expansion of the tubular portion 10 when the mounting bracket 8 is slid over the outer tube 5 on the linear actuator. It is noted that the arm 13 is located across the slit in the tubular portion 10 on the mounting bracket 8. A fastening means 8a is constructed in connection with the axially extending slit 12. This fastening means 8a comprises a rib 15 extending on both sides of the slit 12. Partway in, each side of the rib 15 is furnished with an indentation 16.

FIG. 7 on the drawing shows a perspective view of the linear actuator with fitted mounting bracket 8 and a box 9 in a horizontal position and a box 9 standing upright, ready to be mounted on the linear actuator, as shown in FIG. 2. On the side of the box 9 shown in a horizontal position, there is a longitudinal groove 17, which continues out on the rear side of the box. The shape of the groove 17 corresponds to the rib 15 on the mounting bracket 8. At the sides of the groove 17 there are protrusions 18, a pair 18a at the front end of the groove, and a pair 18b partway in along the groove. The shape of the protrusions 18b located in on the groove 17 corresponds to the shape of the indentations 16 in the rib 15 on the mounting bracket 8. The box 9 is mounted in that it is placed the one with the groove 17 over the rib 15 on the mounting bracket 8, such that the protrusions 18b reach into the indentations 16 on the rib 15 in the mounting bracket 8. The box 9 is then pushed towards the rear, against the housing 1 on the linear actuator, such that the protrusions 18a,18b in the groove 17 grips behind the rib 15, more specifically the area 15a in connection with the indentations 16 and the front end 15b of the rib, and secures the box on the mounting bracket 8 on the outer tube 5 of the linear actuator. The box 9 is secured against unintended detachment in that there are interacting snap-lock connections 19 in the bottom of the groove 17 on the box 9 and in the rib 15 on the mounting bracket 8. In order to secure the box 9 against tilting on the rib 15 of the mounting bracket 8, the arm 13 at the outer end is provided with a cam-shaped protrusion 20, which grips into a thereby shape-conformed recess 21 on the rear side of the box 9. It is noted in this context that a control box can be quite heavy, especially if the power supply is based on a transformer, which is often the case. The torque that is transmitted to the joint between the rib 15 and the associated groove 17 will then be relatively large, for which reason it is expedient to fix the box 9 to the arm 13. It can also be seen from FIG. 7 that the box 9 has two grooves 17a, 17b on the underside, corresponding to the groove 17 on the side of the box, such that the box can be mounted with the underside on the mounting bracket 8 of the linear actuator, such that the box 9 stands upright as shown in FIG. 3. When the box 9 is mounted with the groove 17a, the box does not project above the housing 1 of the linear actuator, i.e. this can then be mounted closely up against an item, such as a flat surface, a beam or the like. If the box is mounted with the second groove 17b, the box projects more or less equally above and below the outer tube 5 of the linear actuator.

FIGS. 8 and 9 of the drawing show another embodiment of a mounting bracket 22 for the box 9, whereby it can be mounted independently of the linear actuator. The mounting bracket 22 is designed as a rib 23, corresponding to the rib 15 on the mounting bracket 8 for a linear actuator. Thus, the rib 23 here also has a pair of indentations 24 partway in, corresponding to the protrusions 18b in the grooves 17,17a, 17b on the box, so that this with a groove can be placed over the mounting bracket 22. The mounting bracket 22 has two screw holes 25 for fastening the mounting bracket with a pair of screws or bolts. The mounting bracket is also provided at one end with a releasable snap-lock part for interaction with the snap-lock part in the box. The box 9 can be detached from the mounting bracket 22 by pressing the resilient snap-lock part 26 out of its engagement with the snap-lock part on the box 9. The box is then displaced axially so that the protrusions 18b come to be located opposite the indentations 24 in the mounting bracket, whereby the box can be pulled out of its engagement with the mounting bracket.

FIG. 10-15 show three examples of different mountings of the box 9. FIG. 10-11 shows how the box 9 can be mounted with the mounting bracket 22 on a tubular cable tray 27. The mounting bracket 22 is fastened initially onto the cable tray 27 with a pair of screws, after which the box can immediately be mounted. In FIG. 10-11 it is shown mounted with the bottom to the cable tray 27, while FIG. 12-13 show it mounted with the side to the cable tray 27. FIG. 14-15 show how the box 9 is mounted with the bottom on a flat surface 28. It should be understood that the box 9 can naturally also be mounted with the side on the plate piece. In many hospital and care beds, the support surface for the mattress has a fixed centre section between the adjustable back rest section and the leg rest section. The box 9 can thus be mounted on the underside of this fixed centre section.

As initially mentioned the box 9, shown in FIG. 2-7 and FIG. 10-15, is a control box containing an electric control for a number of linear actuators and a mains-based power supply. However, there could also be other kinds of boxes involved that can accommodate various other equipment, or the electrical controller and the mains-based power supply may be divided into several boxes. FIG. 16 shows an example of a box 29 containing a rechargeable battery pack. The underside of this box 29 is provided with a groove 17 corresponding to the groove on the box 9, the control box, and can thus be mounted with the mounting bracket 22, which here is shown securely screwed onto a flat surface 28. The upper side of the box 29 has a mounting bracket 22a corresponding to the mounting bracket shown in FIGS. 8 and 9. Instead of designing the mounting bracket 22 as an integral part of the upper side of the box 29, 29a, it may be a mounting bracket as shown in FIGS. 8 and 9 fastened onto the upper side of the box 29, 29a. As indicated and shown in FIG. 17, it is thus possible to connect the boxes 29, 29a.

FIGS. 18 and 19 show how a box 9 (control box) in a corresponding manner can be connected with a box 29 (battery pack). This may be relevant where the actuator system must be capable of operating even when it is not connected to the mains. This may be the case, for example, for hospital beds which are moved around the hospital.

As illustrated in FIG. 20, the box 9 is provided with a cover 30 which can be opened. There are a number of sockets 31 in the space under the cover, shown here with plugs inserted 32, but without the wire. In both sides and the end of the space, there are lead-throughs 33 for wires, such that these can be led out to one side or the other or out through the end. When the cover 30 is closed, its edge will hold the wires in place in the lead-throughs 33. The cover is secured in its closed position by means of two spring legs 34, one on each side of the front end of the cover. There is a tongue 34a on the outer end of the spring legs 34, which engages with a slot 35 intended for that purpose in the end of the box. The cover can be opened by inserting a tool such as the end of a screwdriver, into the slots 35 and pressing the tongues of the spring legs out of their engagement with the slots. It is noted that there is a plug 36 in one corner of the control box for connecting a mains cable 37 provided with a socket.

FIG. 21 shows the box 9 mounted with the side on a cable tray 27 and a cable is shown that is led into the cabling duct. The lead-through 33 in the other side of the box 9 is connected to the end of a cabling duct 27a. The lead-through in the end of the box is in a corresponding manner connected to the end of another cabling duct 27b.

For clarity reasons in the control box in FIG. 22 the electrical plugs are left out and so are the sockets on the platform at the rear end of the space under the cover 30. As it is apparent from FIG. 22 the control box is shown with an open cover 30, the cover comprising an upper side 38, a front end 39 and two sides 40, 41. The two sides 40, 41 extend to the rear in two flaps 40a, 41a with a rounded-off end 40b, 41b beginning at the upper side and continuing in a sloping course 40c, 41c to the underside of the sides 40, 41. There is a hinge pin 42 at the centre of the two rounded-off ends 40b, 41b. The two flaps 40a, 41a are located in a recess 43 in the side of the box, such that the side of the cover is level with the side of the box generally. The recess 43 can be seen in FIG. 23, where one side of the cover is cut away. The recess 43 has a vertical edge 43a extending from the upper side of the box and in a rounding 43b extends into a sloping course 43c corresponding to the sloping course 40c, 41c on the flaps 40, 41 on the cover. There is a track 44 in the recesses 43 for the hinge pin 42 for the cover. The track 44 has a horizontal course 44a from the front end of the recess and extends into a sloping course 44b down towards the bottom of the box. With this design, the cover 33 can be placed on the box 9 in a horizontal movement. This can be crucial if the clearance above the box 9 is limited. The cover 33 is moved over the box until the hinge pins 42 enter the horizontal course 44a of the tracks 44. When the cover is pressed farther over the box, the hinge pins 42 reach into the sloping course 44b of the tracks 44 and thereby pull the rear end of the cover down towards the box. The upper side of the box 9 has a ledge 45 with a height corresponding to the thickness of the upper side 38 of the cover. When the cover is pulled downwards, its rear end is pulled down into the ledge 45, such that the upper side of the box and its cover appear as a flat surface. When the cover is opened to its fully raised position, the rear edge of the upper side 38 will impact against the upper side of the box, and thus act as a stop. The cover will then attempt to rotate about the rear edge as a pivot axis, whereby the hinge pins 42 will be pressed up against the upper side in the tracks 44. The cover will thus be locked in its open position. On the underside of the cover there is a transverse rib 46, which extends across the plugs 32 on the platform and keeps them in place when the cover is closed. Likewise, there is a retainer 47 on the underside of the cover 30 for the plug 32a for preventing unintentional pulling out of this.

In FIGS. 25 and 28 the same linear actuator 1 as in FIGS. 2-4 and 7 is shown, but with a further embodiment of the mounting bracket for insertion over the outer tube 5 on the linear actuator 1. For the same parts the same references as in FIGS. 2-7 are used. The mounting bracket 108 distinguish itself from the mounting bracket 8 shown in FIG. 2-7 in that it has a further indentation 16a in each side of the rib 15. Correspondingly, the longitudinal grooves 117 in the control box 9 has a further pair of protrusions 18c mating the further indentation 16a in the mounting bracket 8. It is noted that the protrusions 18a at the rear end of the groove 117 is bridging the groove such that there is a hollow under this which the front end 15b of the rib 15 reach under. The control box 9 is mounted in the same manner as in the embodiment in FIG. 2-7. The further indentations/protrusions result in a more reliable and stable attachment of the control box 9. In FIGS. 29 and 32-34 a different embodiment of a linear actuator than in FIGS. 2-4 and 7 and FIG. 25, 28 is shown. The linear actuator differs from the linear actuator in FIGS. 2-4 and 7 and 25, 28 by the design of the outer tube 205 and the design of the housing 201. The outer tube 205 is having a cross section made up of a half circle 205a and a truncated cone 205b and the housing 201 is designed with two longitudinal ribs 201a, 201b. For the same parts as in FIGS. 2-4 and 7 and 25, 28 the same references are used. The mounting bracket 208 for insertion over the outer tube 205 is adapted to the different design of the linear actuator. Thus, the opening in the mounting bracket 208 is designed as a half circle and a truncated cone consistent with the cross section of the outer tube 205 of the linear actuator. For fixation of the mounting bracket 208 to the housing one of the two longitudinal ribs 201b is exploited. As is apparent from FIG. 30 the arm 213 is at its rear end designed with a projecting hook 213a. When guiding the mounting bracket 208 over the outer tube 205 of the linear actuator the hook 213a will snap around the longitudinal rib 201b on the housing 201 as shown in FIGS. 32 and 33 and is thereby locked in its position. A control box 9 could then be attached to the linear actuator as described earlier.

In FIGS. 37 and 38 a further embodiment of the stick-like mounting bracket for a box is shown, the improvement is in line with the improvement of the mounting bracket for insertion over the outer tube 5 on the linear actuator as discussed in relation to FIG. 25-28. The mounting bracket 322 distinguish itself from the mounting bracket shown in FIG. 8-9 in that it has a further indentation 24a in each side arranged such that it fits with the design of the longitudinal grooves 17 in the control box 9 depicted in FIGS. 28 and 34. The further indentation 24a/protrusions 18c result in a more stable attachment of a control box 9 as illustrated in FIG. 10-15, but also of battery boxes e.g. as shown in FIG. 39, which corresponds to FIG. 16. However, the mounting bracket of the battery boxes is designed as depicted in FIG. 37-38 and the grooves 17 with a further indentation as the grooves 17 of the control box as depicted in FIG. 28.

For the purpose of mounting a control box 9 by means of the type of mounting brackets depicted in FIGS. 8-9 and 37-38 an improved embodiment thereof is shown in FIG. 40-43. The improvement consists in that at one end of the mounting bracket it is designed with an upright arm 413*a* like the arm on the mounting bracket 8 for insertion over the outer tube 5 on the linear actuator. The upright arm 413 is at the outer end also provided with a cam-shaped protrusion 420 for interacting with the shape-conformed recesses 21*a*.21*b* on the rear end of the control box 9. This improvement results in a more stable attachment of the control box 9, in particular the control box 9 is more secure against tilting.

In the preceding it is described how the mounting bracket depicted in FIG. 37-38 can be used to mounted a control box and a battery box however the mounting bracket could be used to mount other kinds of boxes e.g. a control such as a wireless hand control. In connection with adjustable beds such as bed where the back rest and leg rest could be adjusted by means of an linear actuator system, a wireless hand control often poses a problem, namely where to place it within reach. In FIG. 44 is shown an embodiment of a wireless hand control 500 where a groove 117 is designed on the rear side for mounting the hand control 500 by means of a mounting bracket 322 as depicted in FIG. 37-39. The mounting bracket 322 could be attached e.g. to the bed frame at a location within reach for the occupant of the bed. Needless to say the mounting bracket 22 depicted in FIG. 8-9 is also suitable for the hand control 500 then being designed with a groove 17 as shown on the control box in FIG. 7.

In FIG. 45-47 a further embodiment of a box such as a battery box 29 is shown. The box distinguish itself from the boxes depicted in FIGS. 16-19 and 39 in that it comprises an opening cover 633 with the same construction as the cover 33 of the control box 9 shown in FIG. 22-24. The cover 633 is located in an opening 629*a* in the bottom of the box. For the same parts the same references as in FIGS. 22-27 are used.

Just in case it is noted that the term fastening means also include the terms mounting bracket, bracket, mountings and similar terms.

The invention claimed is:

1. A linear actuator system comprising a linear actuator with a housing, an electric motor with a transmission, a spindle unit, an activation element in connection with the spindle unit and wherein the electric motor via the transmission drives the spindle unit, such that the activation element moves back and forth depending on the direction of rotation of the electric motor, and further comprising a box, such as a control box containing a controller and possibly also a mains-based power supply or a battery box with a battery pack, and wherein the box can be secured to an item, wherein the linear actuator system further comprises a fastening means for the box, wherein the fastening means is configured as an elongated item with a rectangular outline and a square cross-section, wherein the box on the outside is provided with at least one groove for receiving the fastening means, wherein the fastening means and the groove are formed with mutually interacting releasable locking connections, and wherein the fastening means is designed so that it can be secured to an item.

2. The linear actuator system according to claim 1, wherein the fastening means is designed as an independent element.

3. The linear actuator system according to claim 1, wherein the fastening means is designed as an integral part of a box.

4. The linear actuator system according to claim 1, wherein the fastening means is designed as an integral part of a tubular mounting bracket intended for mounting a box, on the linear actuator, wherein the mounting bracket with a tubular portion can be slid over the outer tube of the linear actuator.

5. The linear actuator system according to claim 1, wherein a rib is formed on each side of the fastening means and in that an indentation is formed on the rib partway in, and in that there are protrusions on the side of the groove on the box, one pair at the front end of the groove and one pair partway in along the groove and wherein the protrusions on the groove in terms of shape correspond to the indentations in the rib of the fastening means.

6. The linear actuator system according to claim 1, wherein there are interacting snap-locking connections in the bottom of the groove on the box and in the rib on the fastening means.

7. The linear actuator system according to claim 4, wherein the tubular mounting bracket has an axially extending slit, and wherein the rib on the fastening means extends on both sides of the slit.

8. The linear actuator system according to claim 7, wherein the box is designed with a number of grooves for receiving the fastening means such that the box can be fixed in different positions with respect to the fastening means.

9. The linear actuator system according to claim 8, wherein a control box is designed with a groove on a side of the control box and two grooves on the underside of the control box.

10. The linear actuator system according to claim 2, wherein the fastening means, designed as an independent element, at least at each end is provided with a hole for a screw, bolt, nail or similar means of fastening.

11. The linear actuator system according to claim 1, wherein it comprises a control panel or hand control where a groove is designed on the rear side for mounting the control panel or hand control by means of the fastening means.

12. The linear actuator system according to claim 1, wherein fastening means at one end has an upright arm, the upright arm is at the outer end provided with a cam-shaped protrusion for interacting with a shape-conformed recesses on the rear end of the box.

\* \* \* \* \*